(12) United States Patent
Shih et al.

(10) Patent No.: US 10,395,976 B1
(45) Date of Patent: Aug. 27, 2019

(54) METHOD OF MANUFACTURING SEMICONDUCTOR DEVICE

(71) Applicant: NANYA TECHNOLOGY CORPORATION, New Taipei (TW)

(72) Inventors: Shing-Yih Shih, New Taipei (TW); Szu-Han Chen, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/978,190

(22) Filed: May 13, 2018

(51) Int. Cl.
  *H01L 21/311* (2006.01)
  *H01L 21/02* (2006.01)
  *H01L 21/8234* (2006.01)
  *H01L 21/768* (2006.01)

(52) U.S. Cl.
  CPC ...... *H01L 21/76802* (2013.01); *H01L 21/311* (2013.01)

(58) Field of Classification Search
  CPC ......... H01L 27/11582; H01L 27/11565; H01L 27/11556; H01L 27/11573; H01L 21/76802; H01L 21/31116; H01L 21/31053; H01L 21/31144; H01L 21/0332; H01L 21/31056; H01L 21/31138; H01L 29/78696; H01L 2224/05552
  See application file for complete search history.

(56) References Cited

U.S. PATENT DOCUMENTS 10,181,401 B1 * 1/2019 Shih ................. H01L 21/027
2019/0164829 A1 * 5/2019 Yang ............... H01L 21/76897

* cited by examiner

*Primary Examiner* — Caridad Everhart
(74) *Attorney, Agent, or Firm* — CKC & Partners Co., LLC

(57) ABSTRACT

A method of manufacturing a semiconductor device includes: forming a first patterned target layer on a substrate having a first region and a second region, the first patterned target layer has first stripes and first openings along a first direction; sequentially forming a lower hardmask layer and a middle hardmask layer covering the first patterned target layer; forming a patterned upper hardmask layer on the middle hardmask layer, the patterned upper hardmask layer has second stripes and second openings along a second direction and exposing a portion of the middle hardmask layer; etching the exposed portion of the middle hardmask layer to form third openings exposing a portion of the lower hardmask layer; and etching the exposed portion of the lower hardmask layer and the first patterned target layer thereunder to form a second patterned target layer having rounded patterns on the first region.

14 Claims, 20 Drawing Sheets

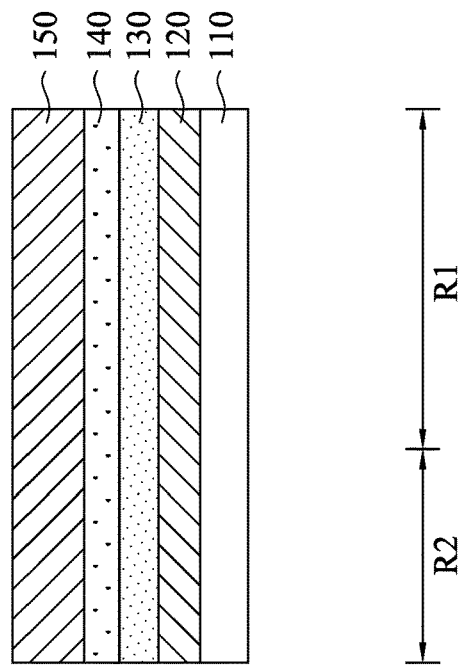
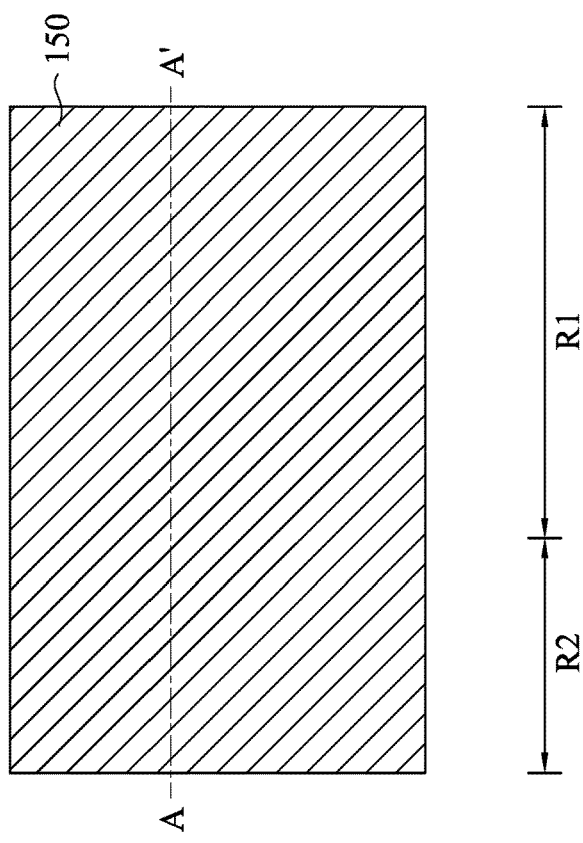
Fig. 1B
Fig. 1A

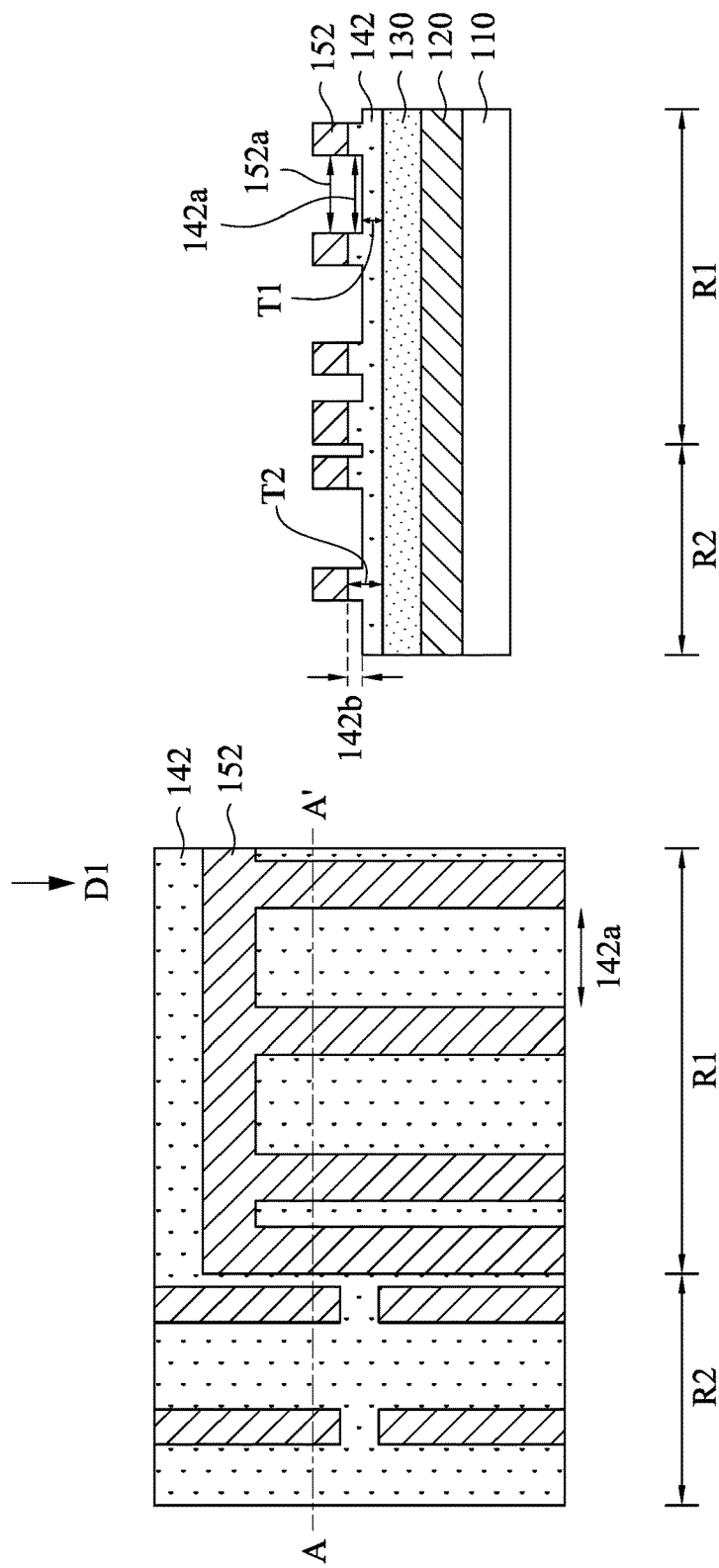

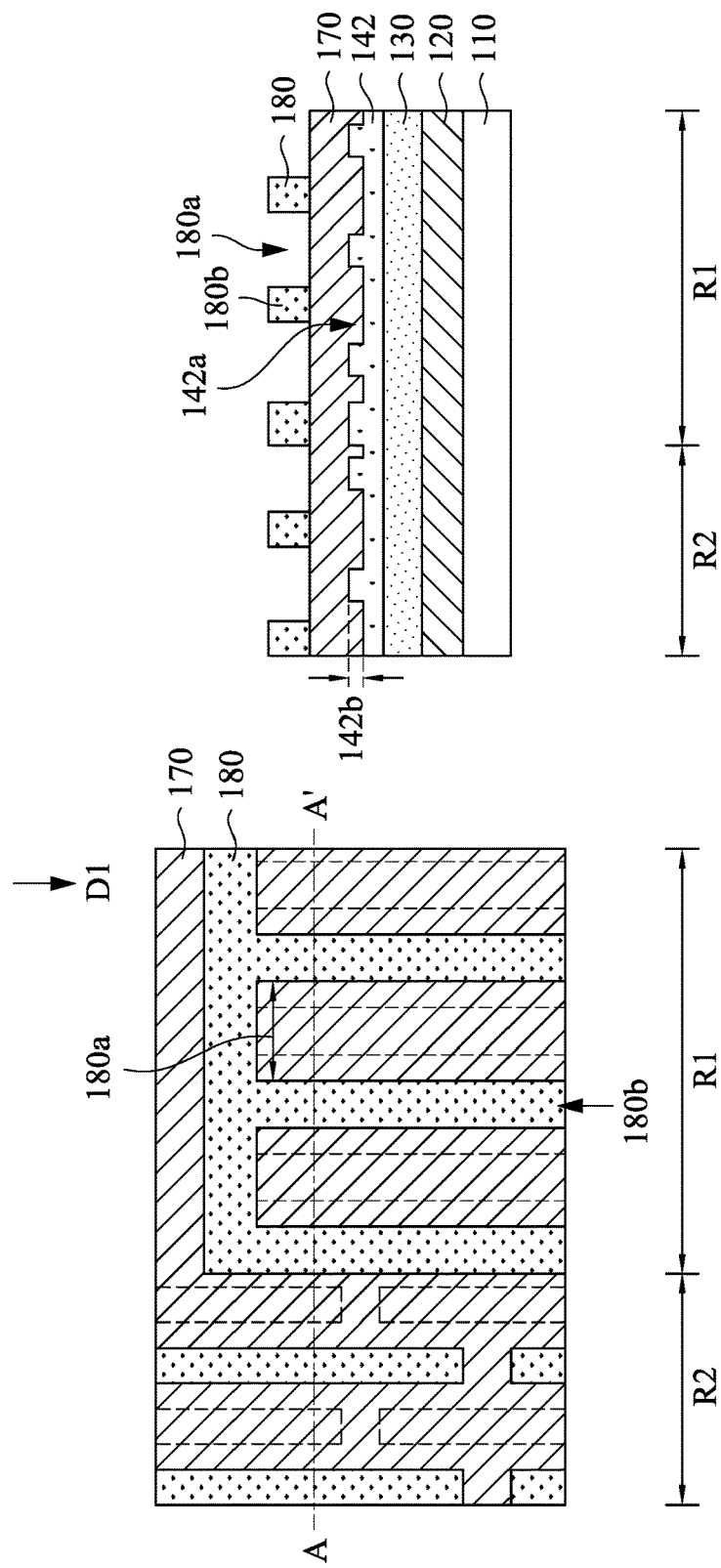

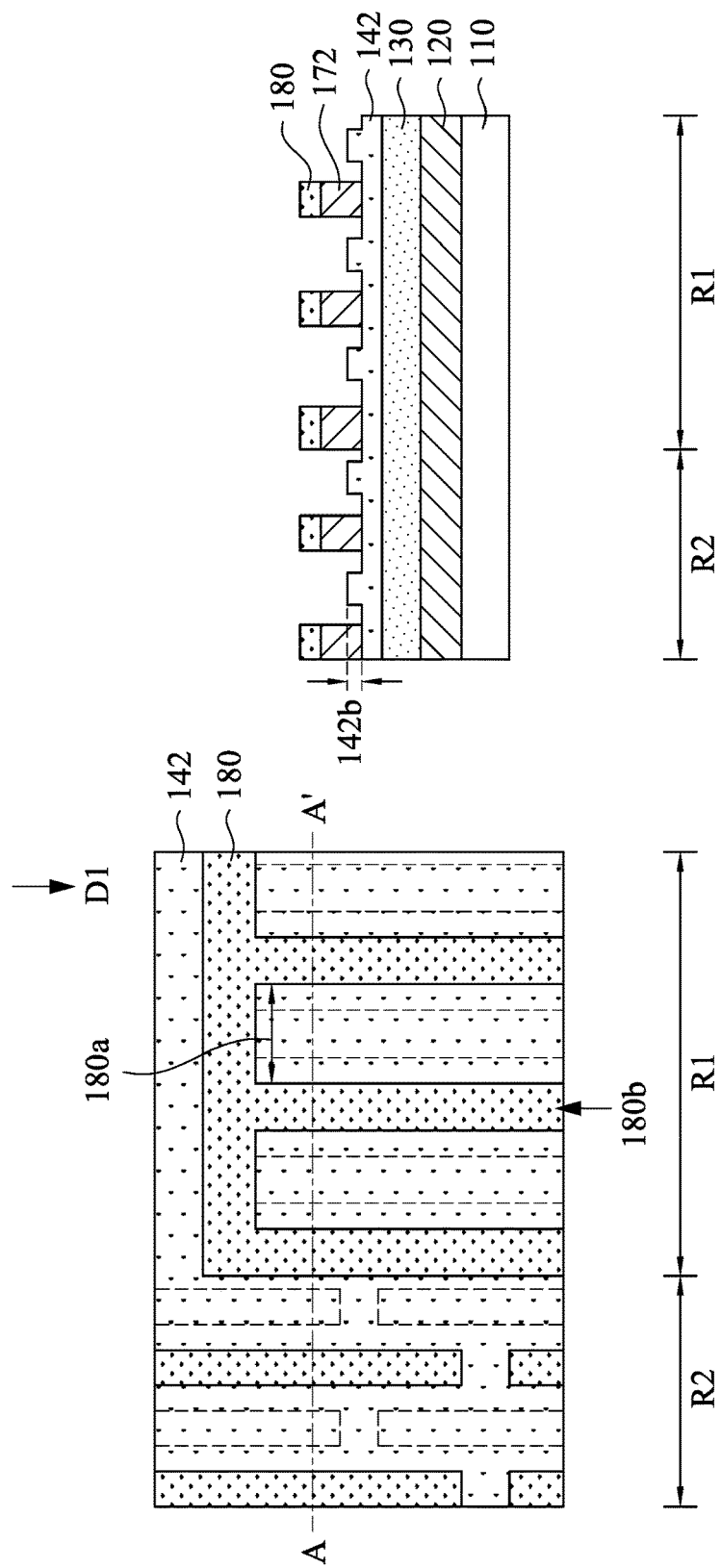

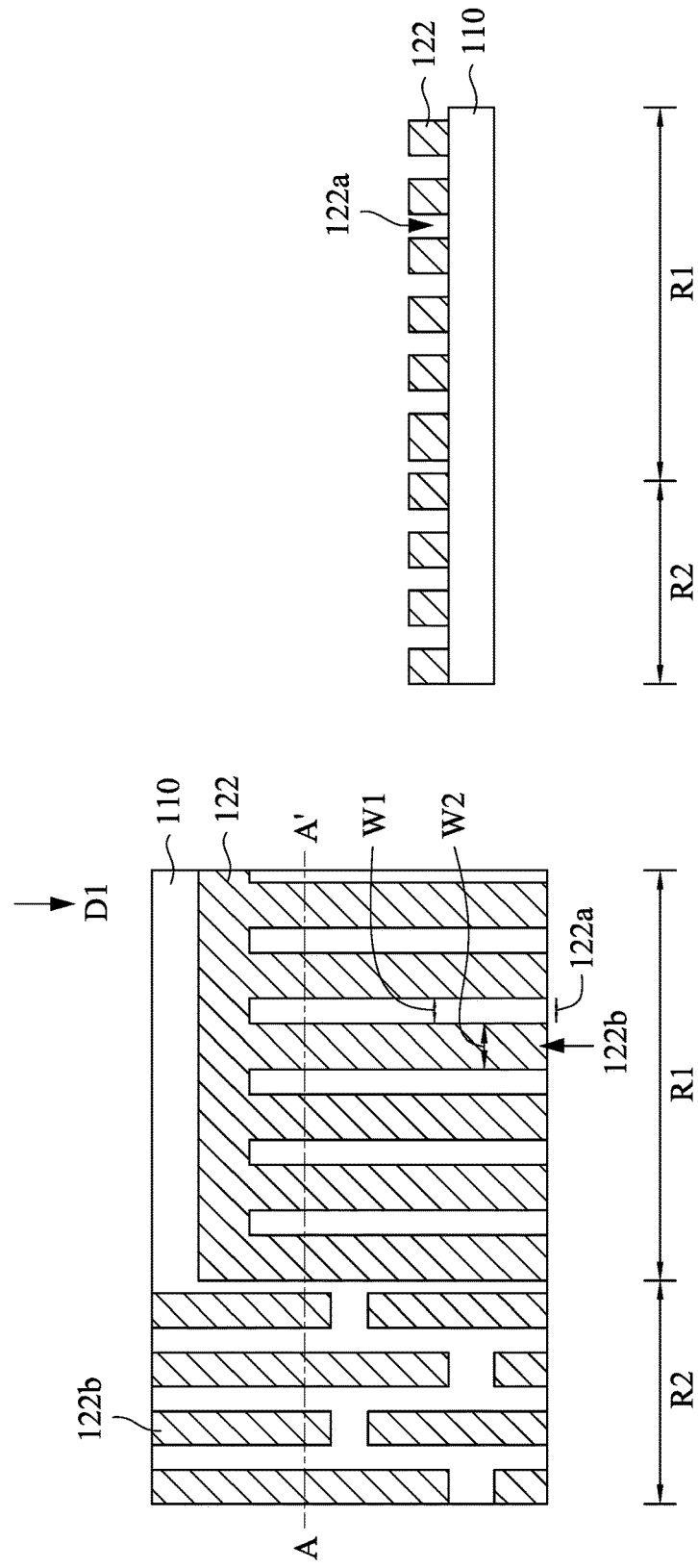

METHOD OF MANUFACTURING SEMICONDUCTOR DEVICE

BACKGROUND

Field of Invention

The present invention relates to a method of manufacturing a semiconductor device. More particularly, the present invention relates to a method of manufacturing a semiconductor device having fine patterns.

Description of Related Art

The semiconductor integrated circuit (IC) industry has experienced rapid growth. Along with the rapidly growing IC industry, the semiconductor devices are trending toward a smaller and highly integrated design. Therefore, there is a need for fabricating fine patterns with different patterns in the semiconductor devices, and the pitch of the fine patterns and critical dimension in the semiconductor devices have to be reduced as well.

To meet this requirement, the so-called double patterning process has been proposed. However, the conventional double patterning process is complicated and usually costs much. Accordingly, there is a call for addressing the issues mentioned above.

SUMMARY

The invention provides a method of manufacturing a semiconductor device, including operations of: forming a first patterned target layer on a substrate having a first region and a second region, the first patterned target layer has a plurality of first stripes and a plurality of first openings on the first and second regions and extending along a first direction, each first opening is disposed between adjacent ones of the first stripes and exposing a portion of the substrate; sequentially forming a lower hardmask layer and a middle hardmask layer covering the first patterned target layer; forming a patterned upper hardmask layer on the middle hardmask layer, the patterned upper hardmask layer has a plurality of second stripes and a plurality of second openings each between adjacent ones of the second stripes, the second stripes and the openings are positioned on the first region and along a second direction that is different from the first direction, and the second openings expose a portion of the middle hardmask layer; etching the exposed portion of the middle hardmask layer to form a plurality of third openings along the second direction and exposing a portion of the lower hardmask layer; and etching the exposed portion of the lower hardmask layer and the first patterned target layer thereunder to form a second patterned target layer, the second patterned target layer has a plurality of rounded patterns on the first region of the substrate.

In some embodiments, each first opening has a width less than a width of each first stripe.

In some embodiments, forming the patterned upper hardmask layer on the middle hardmask layer includes: depositing a first-hardmask layer overlaying the middle hardmask layer; patterning the first-hardmask layer to form at least a trench along the second direction; forming spacers on sidewalls of the trench along the second direction; forming a second-hardmask layer covering the patterned first-hardmask layer and the spacers, and filling a remaining space of the trench; removing a portion of the second-hardmask layer to expose the spacers; and removing the spacers, thereby forming the patterned upper hardmask layer having the second stripes and second openings.

In some embodiments, forming the spacers on the sidewalls of the trench includes: depositing a spacer layer having vertical portions on the sidewalls of the trench and a horizontal portion on a bottom of the trench; and removing the horizontal portion to expose the bottom of the trench, the vertical portions are remained and form the spacers.

In some embodiments, each spacer has a width less than a width of the trench.

In some embodiments, etching the exposed portion of the lower hardmask layer and the first patterned target layer thereunder includes cutting the first stripes over the first region of the substrate.

In some embodiments, the middle hardmask layer is a single layer.

In some embodiments, the middle hardmask layer includes two layers.

In some embodiments, the lower hardmask layer and the middle hardmask layer are made of different material.

In some embodiments, the middle hardmask layer and the patterned upper hardmask layer are made of different material.

In some embodiments, the lower hardmask layer includes amorphous carbon, silicon oxide, silicon nitride, silicon oxynitride, silicon or polysilicon oxide.

In some embodiments, the middle hardmask layer includes silicon oxide, silicon nitride, silicon oxynitride or silicon.

In some embodiments, the patterned upper hardmask layer includes amorphous carbon, silicon oxide, silicon nitride, silicon oxynitride, silicon or polysilicon oxide.

In some embodiments, forming the first patterned target layer including: forming a target layer, a first shielding layer, a second shielding layer, and a third shielding layer in sequence on the substrate; patterning the third shielding layer to form a patterned third shielding layer, the patterned third shielding layer has a plurality of openings exposing a portion of the second shielding layer; partially etching the portion of the second shielding layer to form a patterned second shielding layer having a plurality of protruding portions and a plurality of recesses each between adjacent ones of the protruding portions, the protruding portions and the recesses extend along the first direction; removing the patterned third shielding layer; forming a fourth shielding layer on the patterned second shielding layer; forming a patterned photoresist layer on the fourth shielding layer, the patterned photoresist layer has a plurality of stripe patterns and a plurality of apertures each between adjacent ones of the stripe patterns, the stripe patterns and the apertures extend along the first direction, and the stripe patterns are aligned with the recesses of the patterned second shielding layer; selectively etching the fourth shielding layer using the patterned photoresist layer as a mask to expose the protruding portions of the patterned second shielding layer; selectively etching the patterned second shielding layer and the first shielding layer using the protruding portions and the patterned photoresist layer as a mask to expose a portion of the target layer; and etching the exposed portion of the target layer to form the first patterned target layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIGS. 1A-20A are schematic top views of a semiconductor device during various manufacturing stages according to some embodiments of this invention.

FIGS. 1B-20B are schematic cross-sectional views corresponding respectively to FIGS. 1A-20A.

DETAILED DESCRIPTION

Figure 2B:
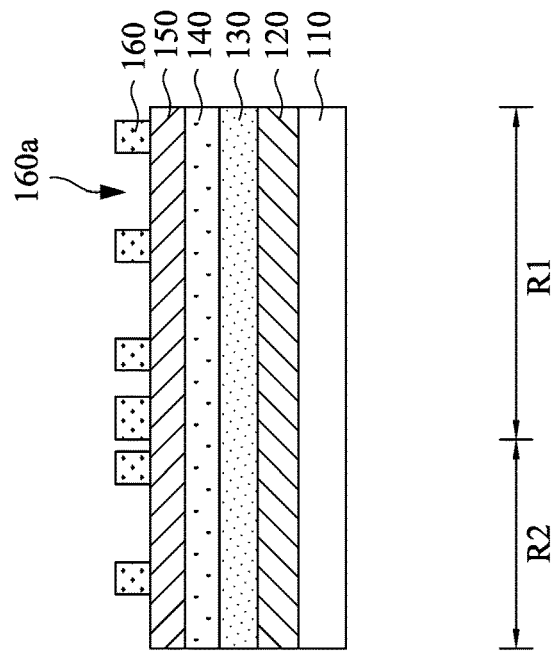

Reference will now be made in detail to the present embodiments of the invention, examples of which are illustrated in the accompanying drawings. Wherever possible, the same reference numbers are used in the drawings and the description to refer to the same or like parts.

The terms "forming," "form," "deposit," or "dispose" are used herein to describe the act of applying a layer of material to another layer. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a layer. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD).

FIGS. 1A-20A are schematic top views of a semiconductor device during various manufacturing stages according to some embodiments of this invention, and FIGS. 1B-20B are schematic cross-sectional views corresponding respectively to FIGS. 1A-20A taken along the line A-A'. Please refer to the top views and their respective cross-sectional views to have a better understanding for the exemplary process flow provided below.

Referring to FIG. 1A and FIG. 1B, a target layer 120, a first shielding layer 130, a second shielding layer 140, and a third shielding layer 150 are formed in sequence on a substrate 110. The substrate 110 has a first region R1 and a second region R2. In one embodiment of the present invention, the first region R1 is an array region, and the second region R2 is a peripheral region. The thicknesses of the first shielding layer 130, the second shielding layer 140, and the third shielding layer 150 may be appropriately varied by those skilled in the art.

In one embodiment, the substrate 110 is a silicon substrate. Alternatively, the substrate 110 may comprise another elementary semiconductor, such as silicon and germanium; a compound semiconductor including IV-IV compound semiconductors, such as SiC and SiGe; III-V compound semiconductors, such as GaAs, GaP, GaN, InP, InAs, InSb, GaAsP, AlGaN, AlInAs, AlGaAs, GaInAs, GaInP, and/or GaInAsP; or combinations thereof. In one embodiment of the present invention, the substrate 110 is a silicon layer of a silicon-on insulator (SOI) substrate. Insulating material such as silicon oxide ($SiO_2$) may also be used as the substrate 110.

In one embodiment of the present invention, the target layer 120 is a metal layer or a dielectric material layer. In one embodiment of the present invention, the first shielding layer 130 is an amorphous carbon layer, a silicon layer, a silicon nitride (SiN) layer, a silicon carbon nitride (SiCN) layer or a silicon oxide ($SiO_2$) layer, but not limited thereto. In one embodiment of the present invention, the second shielding layer 140 includes silicon oxide, silicon nitride (SiN), silicon oxynitride (SiON), silicon carbide, or the like.

In some embodiments, the first shielding layer 130 and the second shielding layer 140 are made of different material, that is, the first shielding layer 130 may have an etch selectivity different from the second shielding layer 140.

In some embodiments, the third shielding layer 150 and the second shielding layer 140 are made of different material, that is, the third shielding layer 150 may have an etch selectivity different from the second shielding layer 140. In one embodiment of the present invention, the third shielding layer 150 includes polyester (PET), polyolefin, resin, or other suitable organic material. In one embodiment, the third shielding layer 150 is formed by a spin-on coating process.

Figure 2A:
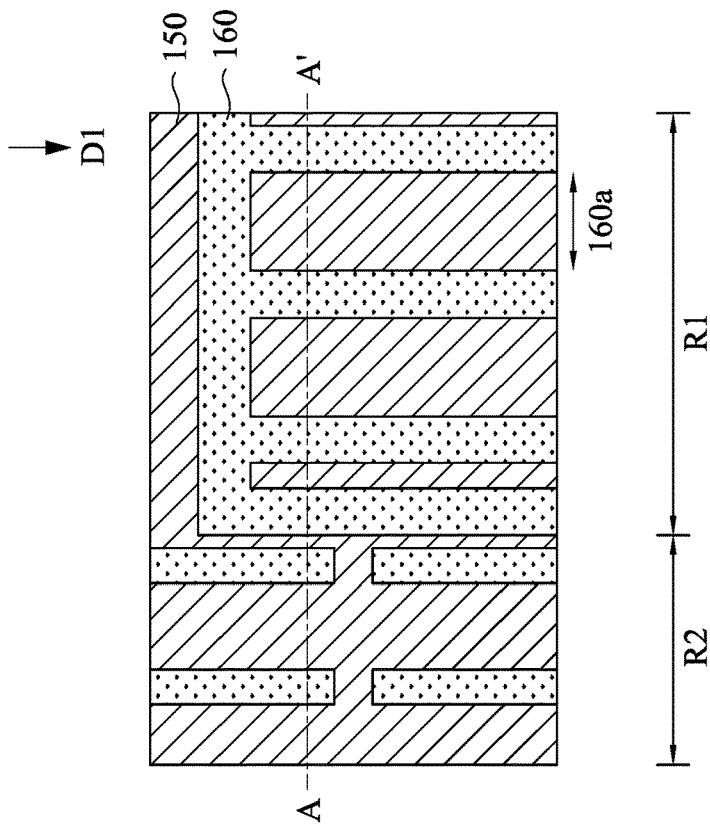

Referring to FIG. 2A and FIG. 2B, a patterned photoresist layer 160 is formed on the third shielding layer 150. The patterned photoresist layer 160 has a plurality of openings 160a exposing portions of the third shielding layer 150 in the first region R1 and the second region R2. It is noted that the openings 160a are extended along a first direction D1 and may be of unequal widths.

Figures 3A, 3B:
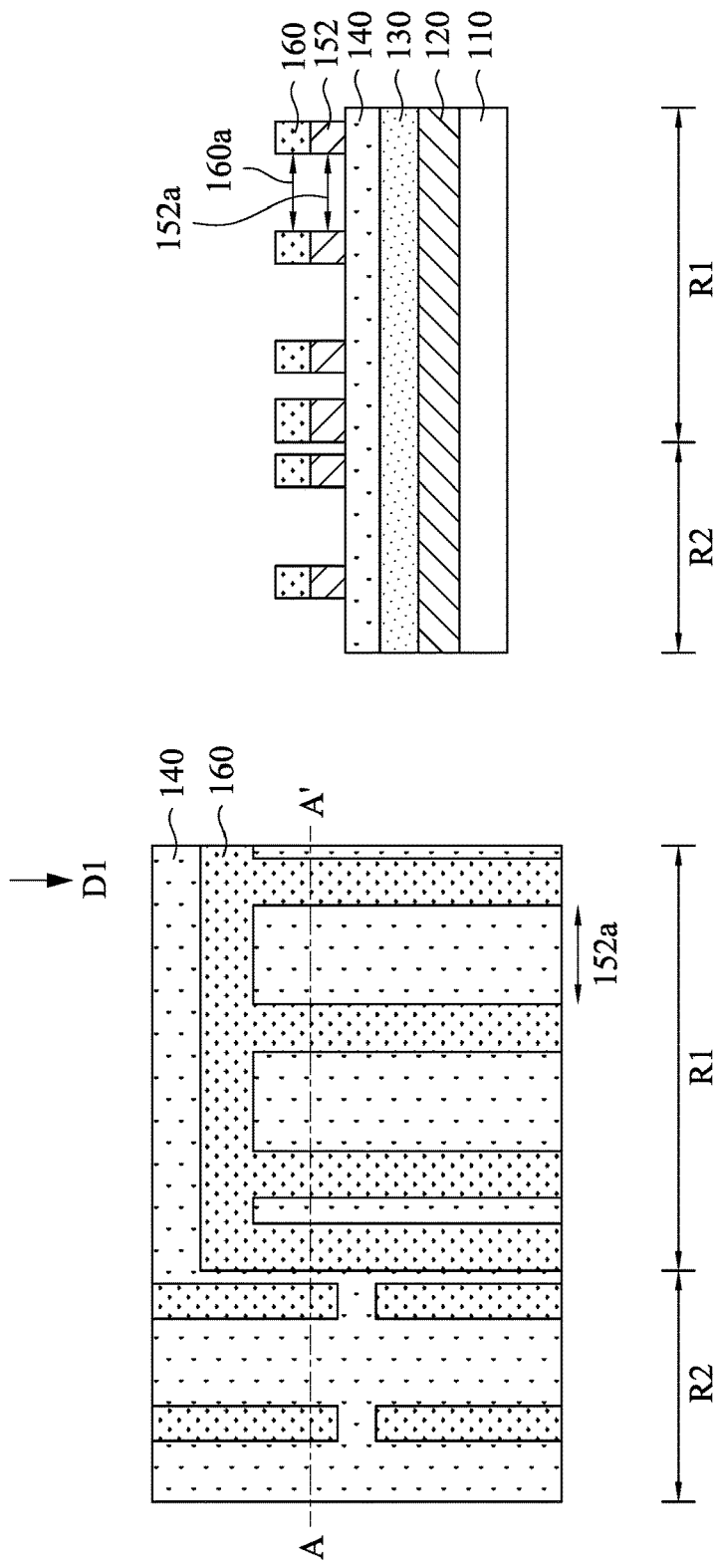

The third shielding layer 150 is then etched using the patterned photoresist layer 160 as an etching mask. As shown in FIG. 3A and FIG. 3B, a patterned third shielding layer 152 is formed under the patterned photoresist layer 160. The patterned third shielding layer 152 has a plurality of openings 152a corresponding to the openings 160a of the patterned photoresist layer 160. The openings 152a expose portions of the second shielding layer 140 in the first region R1 and the second region R2. The patterned photoresist layer 160 is then removed. In one embodiment, the third shielding layer 150 is etched by using an anisotropic etching process such as dry etching process known in the art.

Figures 5A, 5B:
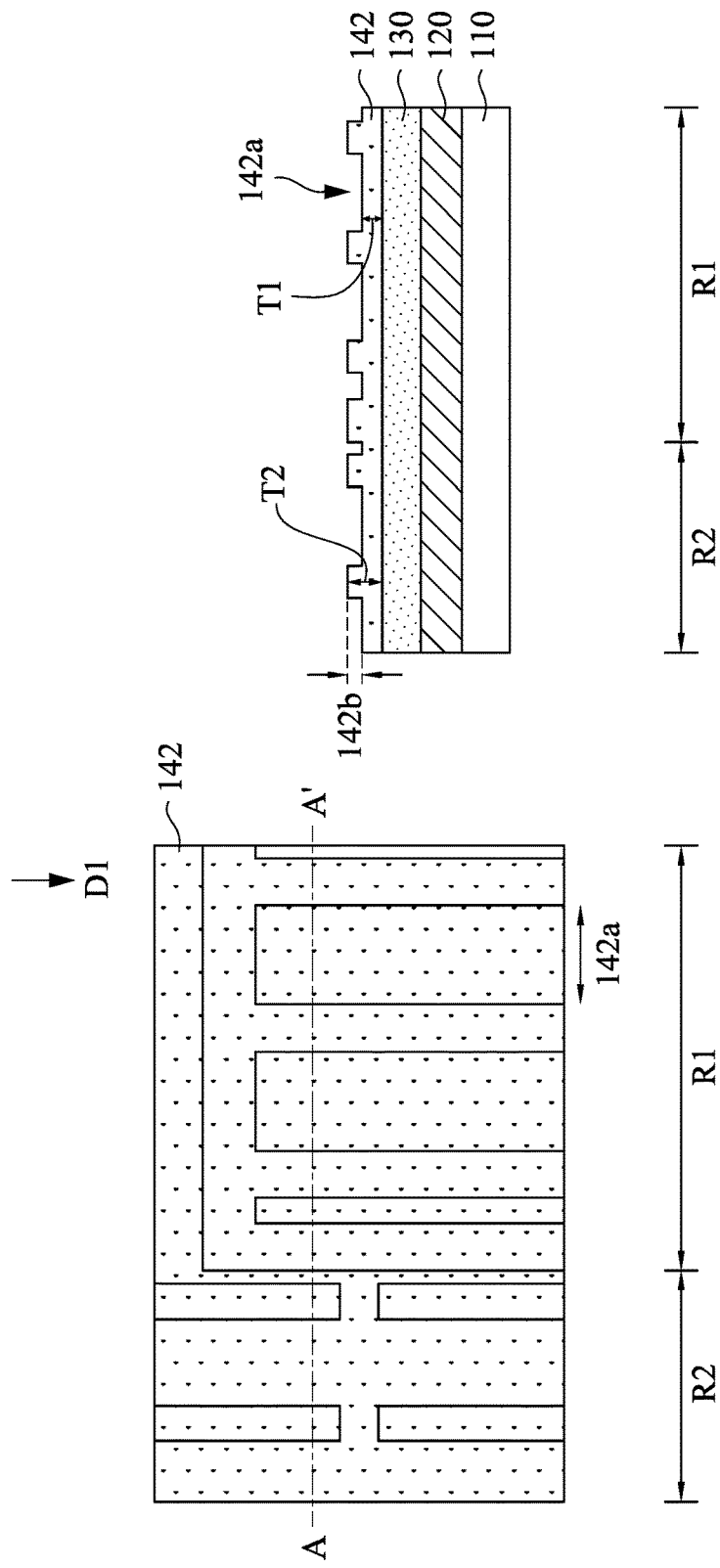

Sequentially, the exposed portions of the second shielding layer 140 are partially etched to form a patterned second shielding layer 142 shown in FIG. 4A and FIG. 4B. The patterned second shielding layer 142 has a plurality of recesses 142a and a plurality of protruding portions 142b. Each of the recesses 142a is located between adjacent ones of the protruding portions 142b. The recesses 142a and the protruding portions 142b are extended along the first direction D1. As shown in FIG. 4B, the recesses 142b are exposed, while the protruding portions 142b are covered by the patterned third shielding layer 152. It is understood that the recesses 142a correspond to the openings 152a of the patterned third shielding layer 152. The patterned third shielding layer 152 is then removed, and therefore both of the recesses 142a and the protruding portions 142b of the patterned second shielding layer 142 are exposed, as shown in FIG. 5A and FIG. 5B. The patterned second shielding layer 142 has a bottom portion with a thickness T1 under the recesses 142a, and the protruding portions 142b have a thickness T2 that is greater than the thickness T1. The thickness T1 and the thickness T2 may be appropriately varied by those skilled in the art.

Figures 6A, 6B:
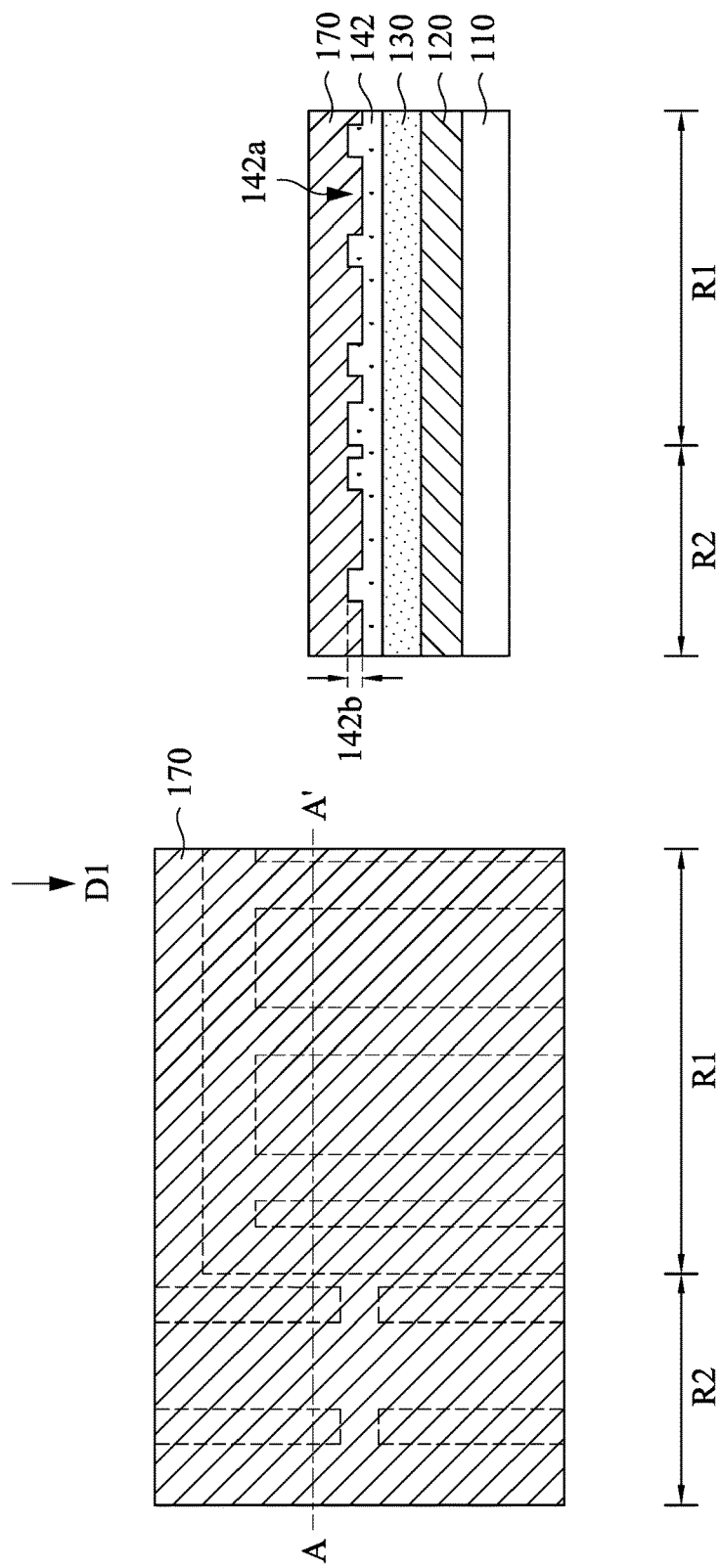

Referring to FIG. 6A and FIG. 6B, a fourth shielding layer 170 is formed on the patterned second shielding layer 142. The fourth shielding layer 170 fills into the recesses 142a and covers the protruding portions 142a. The material of the fourth shielding layer 170 may be the same as the third shielding layer 150. In one embodiment, the fourth shielding layer 170 may be formed by spin-on coating.

Referring to FIG. 7A and FIG. 7B, a patterned photoresist layer 180 is formed on the fourth shielding layer 170. The patterned photoresist layer 180 has a plurality of apertures 180a and a plurality of stripe patterns 180b. Each of the apertures 180a is located between adjacent ones of the stripe patterns 180b. The apertures 180a and the stripe patterns 180*b* are extended along the first direction D1. The stripe patterns 180*b* are aligned with the recesses 142*a* of the second shielding layer 142.

Figure 9B:
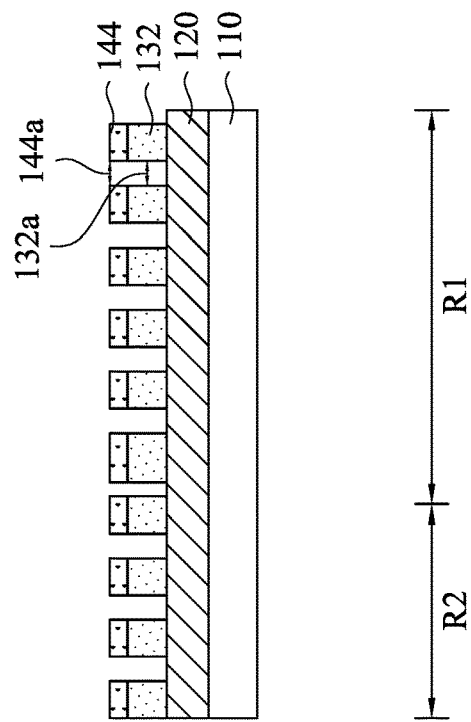
Figure 9A:
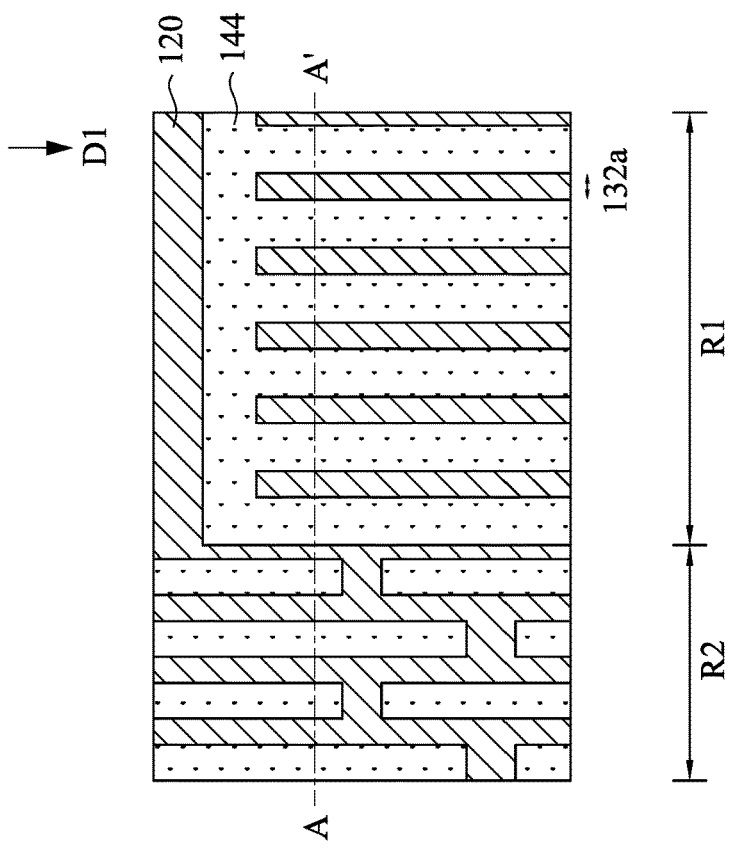

Next, the fourth shielding layer 170 is selectively etched by using the patterned photoresist layer 180 as a mask. As shown in FIG. 8A and FIG. 8B, a patterned fourth shielding layer 172 is formed after the selectively etching. The protruding portions 142*b* of the patterned second shielding layer 142 are exposed. Sequentially, as shown in FIG. 9A and FIG. 9B, the patterned second shielding layer 142 and the first shielding layer 130 are selectively etched by using the protruding portions 142*b* and the patterned photoresist layer 180 as a mask so as to form a double-patterned second shielding layer 144 and the patterned first shielding layer 132 respectively. The patterned first shielding layer 132 is covered by the double-patterned second shielding layer 144, and a portion of the target layer 120 is exposed. The patterned photoresist layer 180 and the patterned fourth shielding layer 172 shown in FIGS. 8A and 8B may be removed after the etching process.

It is noted that the double-patterned second shielding layer 144 has a plurality of openings 144*a*. Meanwhile, the patterned first shielding layer 132 has a plurality of openings 132*a* corresponding to the openings 144*a*, as shown in FIG. 9B. The openings 132*a* expose a portion of the target layer 120.

Next, as shown in FIG. 10A and FIG. 10B, the exposed portion of the target layer 120 is etched by using the double-patterned second shielding layer 144 and the patterned first shielding layer 132 as a mask. Therefore, a first patterned target layer 122 is formed over the first region R1 and the second region R2 of the substrate 110. The double-patterned second shielding layer 144 and the patterned first shielding layer 132 are then removed to expose the first patterned target layer 122. The first patterned target layer 122 has a plurality of first openings 122*a* corresponding to the openings 132*a* shown in FIG. 9B. It is noted that the first openings 122*a* are extended along the first direction D1.

The first patterned target layer 122 also has a plurality of first stripes 122*b* on the first region R1 and second region R2 and extending along a first direction D1. Each of the first openings 122*a* is disposed between adjacent ones of the first stripes 122*b* and exposing a portion of the substrate 110. It is noted that each of the first openings 122*a* has a width W1 less than a width W2 of each first stripe 122*b*.

Figure 11B:
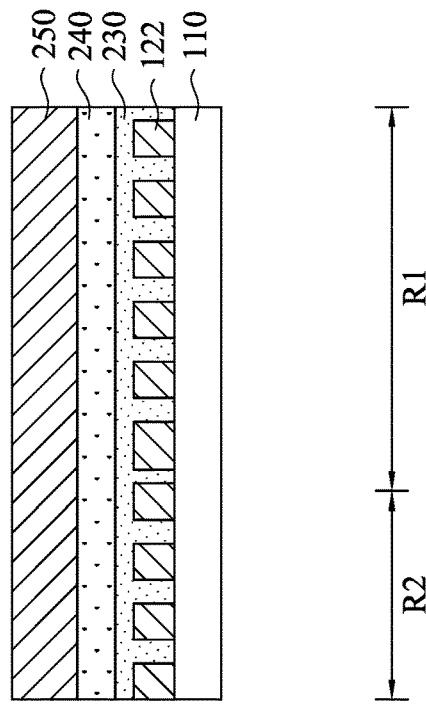
Figure 11A:
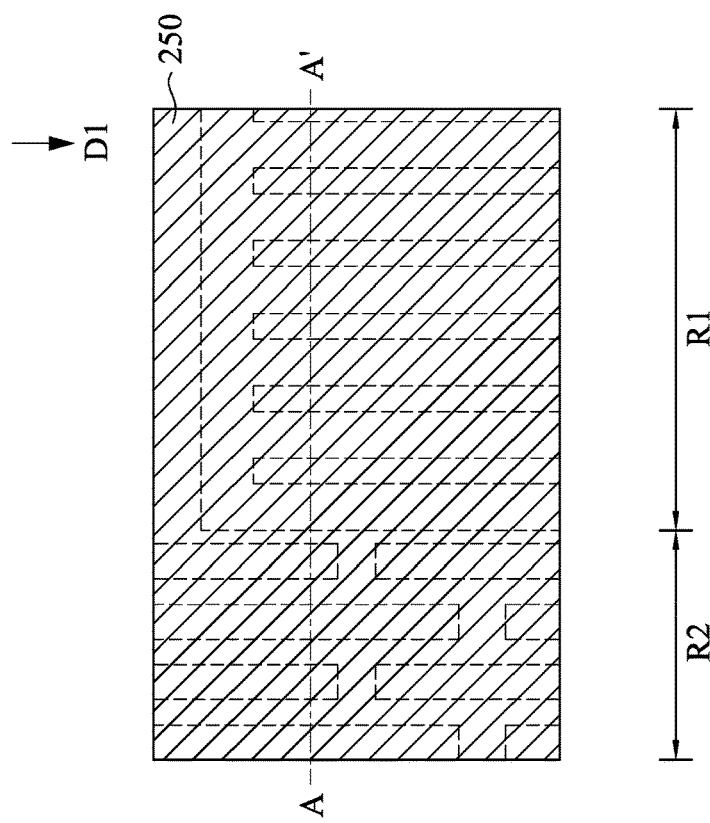

Referring to FIG. 11A and FIG. 11B, a lower hardmask layer 230, a middle hardmask layer 240 and a first-hardmask layer 250 are sequentially formed and covering the first patterned target layer 122. The lower hardmask layer 230 fills into the openings 122*a* of the first patterned target layer 122. The thicknesses of the lower hardmask layer 230, the middle hardmask layer 240, and the first-hardmask layer 250 may be appropriately varied by those skilled in the art.

In some embodiments of the invention, the lower hardmask layer 230 and the middle hardmask layer 240 are made of different material, that is, the lower hardmask layer 230 may have an etch selectivity different from the middle hardmask layer 240. In some embodiments of the invention, the lower hardmask layer 230 includes amorphous carbon, silicon oxide, silicon nitride, silicon oxynitride, silicon or polysilicon oxide. In some embodiments of the invention, the middle hardmask layer 240 includes silicon oxide, silicon nitride, silicon oxynitride or silicon.

In some embodiments of the invention, the middle hardmask layer 240 is a single layer. In yet other embodiments of the invention, the middle hardmask layer 240 includes two or more than two layers.

In one embodiment of the present invention, the first-hardmask layer 250 includes polyester (PET), polyolefin, resin, or other suitable organic material. In one embodiment, the first-hardmask layer 250 is formed by a spin-on coating process.

Figures 12A, 12B:
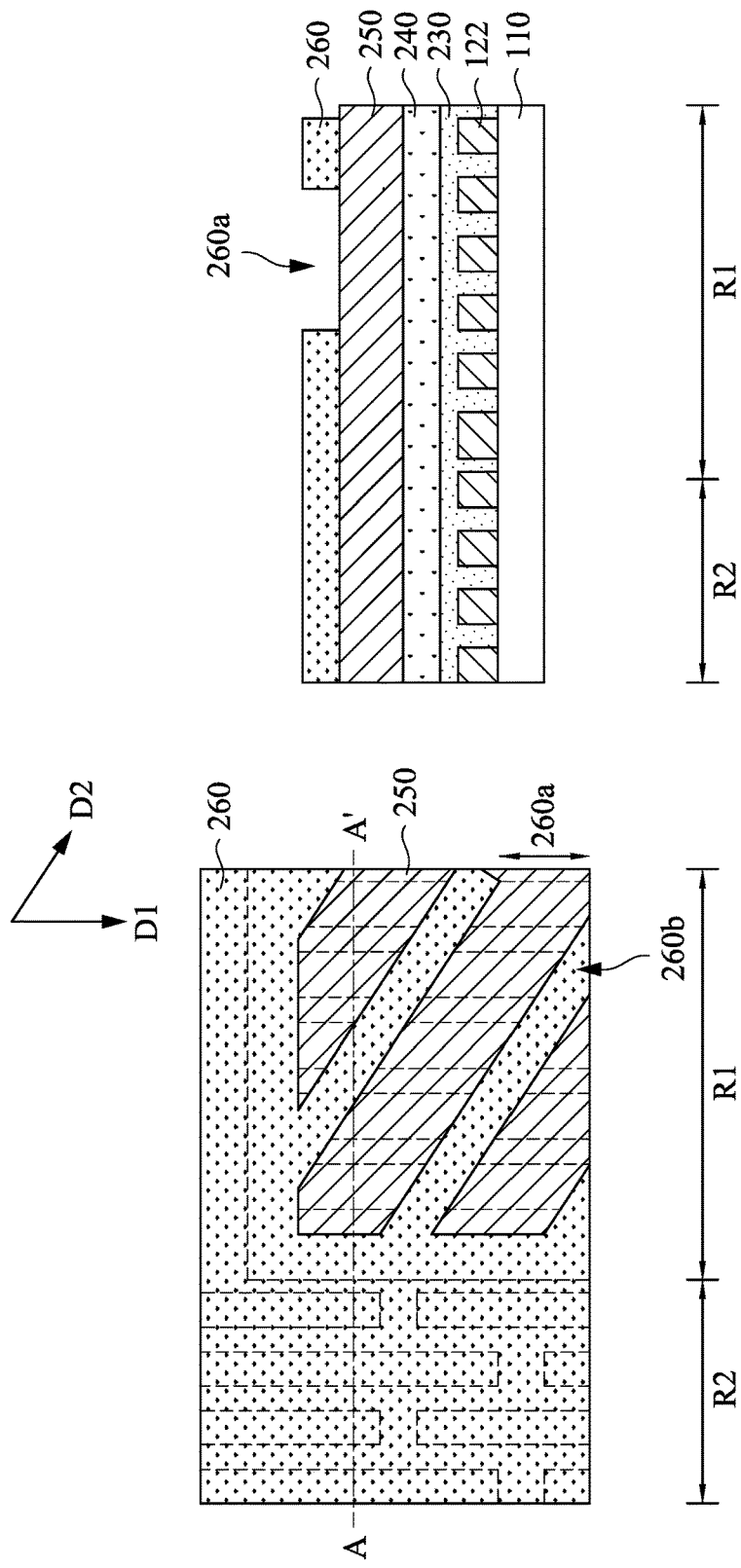

Referring to FIG. 12A and FIG. 12B, a patterned photoresist layer 260 is formed on the first-hardmask layer 250. The patterned photoresist layer 260 has a plurality of apertures 260*a* and a plurality of stripe patterns 260*b*. Each of the apertures 260*a* is located between adjacent ones of the stripe patterns 260*b*. The apertures 260*a* and the stripe patterns 260*b* are extended along a second direction D2 that is different from the first direction D1, and the apertures 260*a* expose a portion of the first-hardmask layer 250.

Figures 13A, 13B:
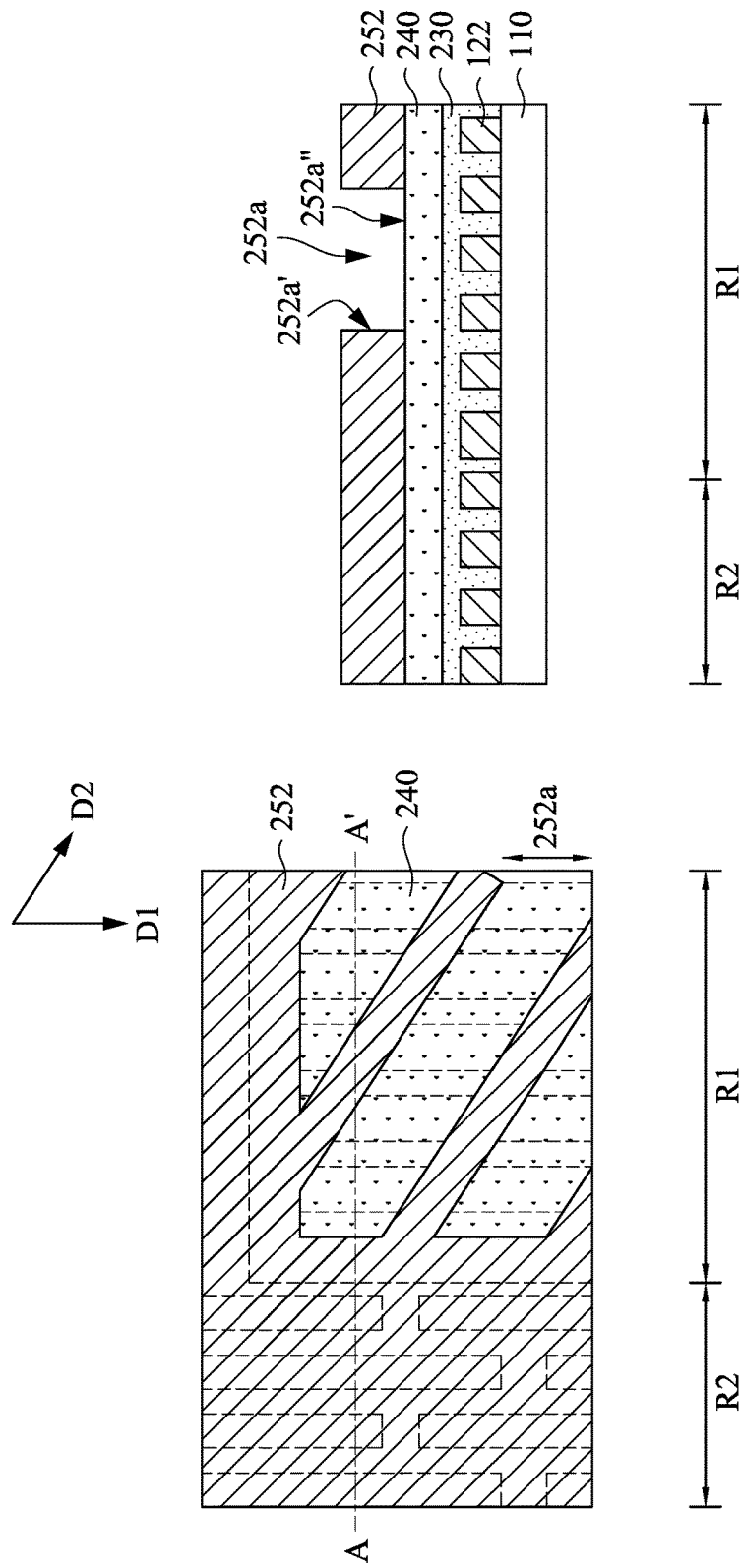

Sequentially, the first-hardmask layer 250 is patterned by using the patterned photoresist layer 260 as a mask. The patterned photoresist layer 260 is then removed. As shown in FIG. 13A and FIG. 13B, a patterned first-hardmask layer 252 is formed on the middle hardmask layer 240. The patterned first-hardmask layer 252 has a plurality of trenches 252*a* corresponding to the openings 260*a* of the patterned photoresist layer 260 shown in FIG. 12B. The trenches 252*a* are extended along the second direction D2 and exposing portions of the middle hardmask layer 240 in the first region R1. The trench 252*a* has sidewalls 252*a*' and a bottom 252*a*".

Figures 14A, 14B:
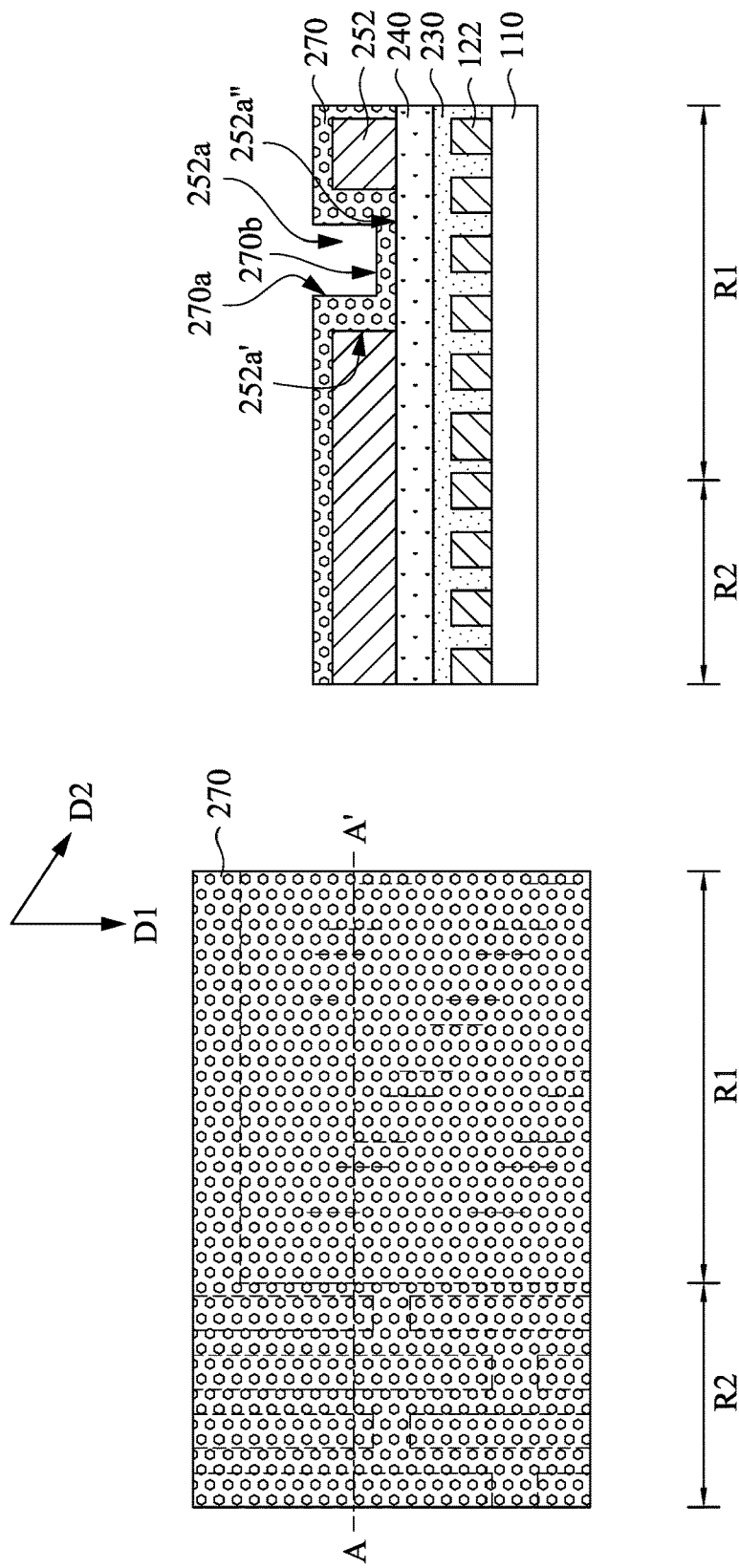

Referring to FIG. 14A and FIG. 14B, a spacer layer 270 is conformally deposited on the patterned first-hardmask layer 252. As shown in FIG. 14B, the spacer layer 270 has vertical portions 270*a* and horizontal portions 270*b*. The vertical portions 270*a* are located on the sidewalls 252*a*' of the trench 252*a* and the horizontal portions 270*b* are located on the bottom 252*a*" and the top surface of the trench 252*a*. In one embodiment, the spacer layer 270 may include silicon, silicon nitride (SiN), silicon carbon nitride (SiCN) or silicon oxide ($SiO_2$). It is understood that the spacer layer 270 and the patterned first-hardmask layer 252 are made of different material.

Figures 15A, 15B:
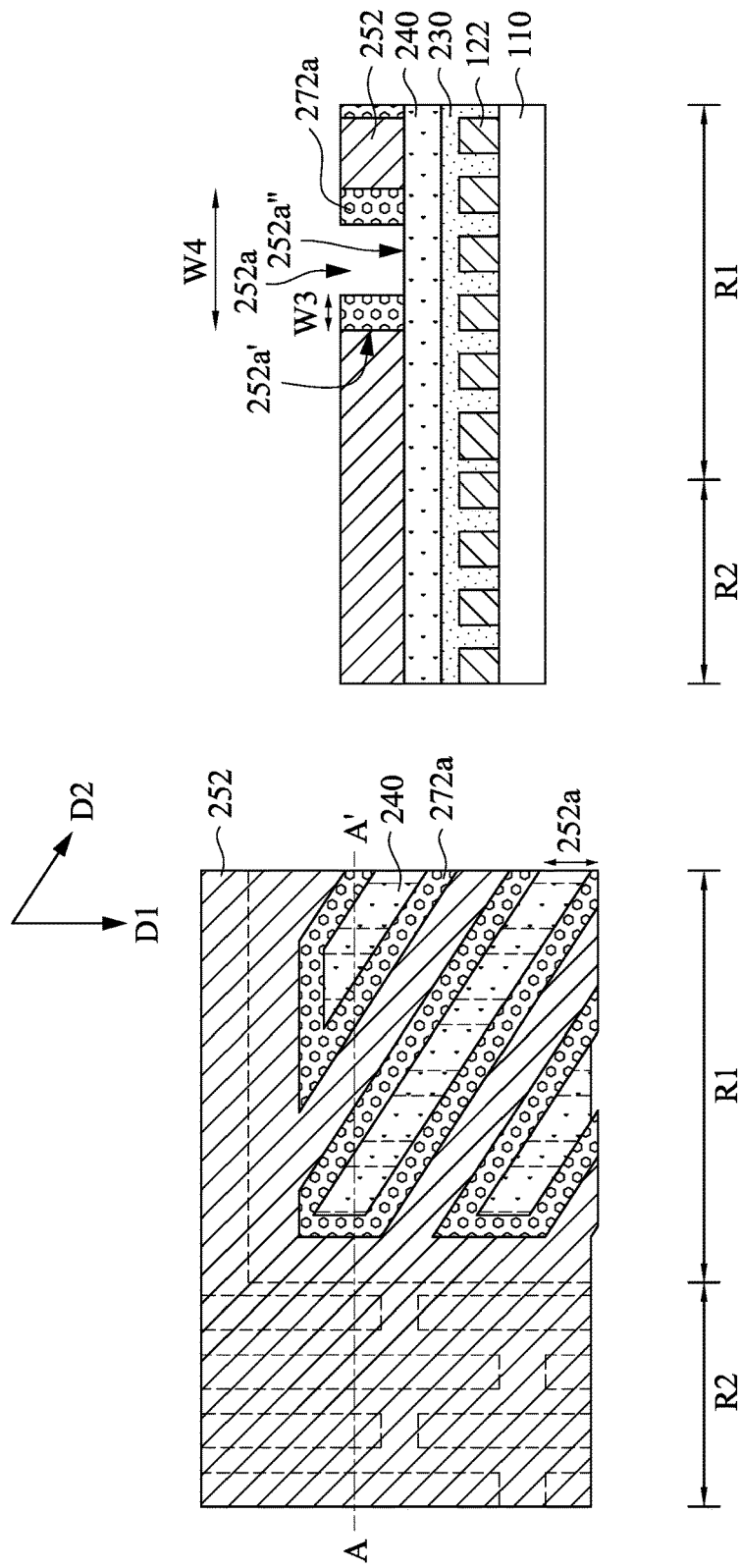

As shown in FIG. 15A and FIG. 15B, the horizontal portion 270*b* of the spacer layer 270 is removed to expose the bottom 252*a*" of the trench 252*a*, wherein the vertical portions 270*a* are remained. The remained vertical portions 270*a* constitute the spacers 272*a*. The spacers 272*a* are located on the sidewalls 252*a*' of the trench 252*a* along the second direction D2. In one embodiment, each spacer 272*a* has a width W3 less than a width W4 of the trench 252*a*. It is noted that a portion of the middle hardmask layer 240 is exposed.

Figures 16A, 16B:
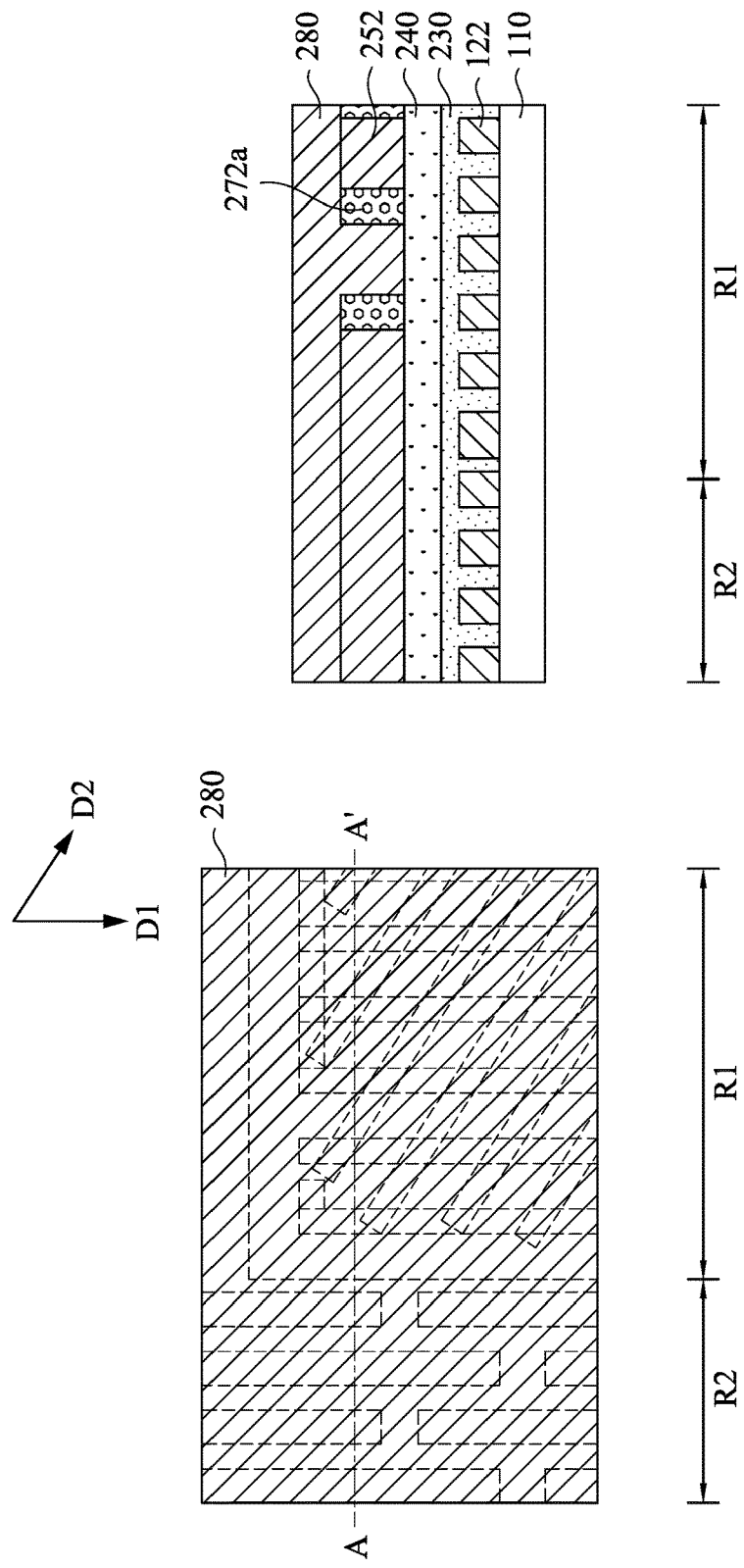

Referring to FIG. 16A and FIG. 16B, a second-hardmask layer 280 is formed covering the patterned first-hardmask layer 252 and the spacers 272*a*. The second-hardmask layer 280 also fills a remaining space of the trench 252*a* shown in FIG. 15B. The material of the second-hardmask layer 280 may be the same with the patterned first-hardmask layer 252.

Figures 17A, 17B:
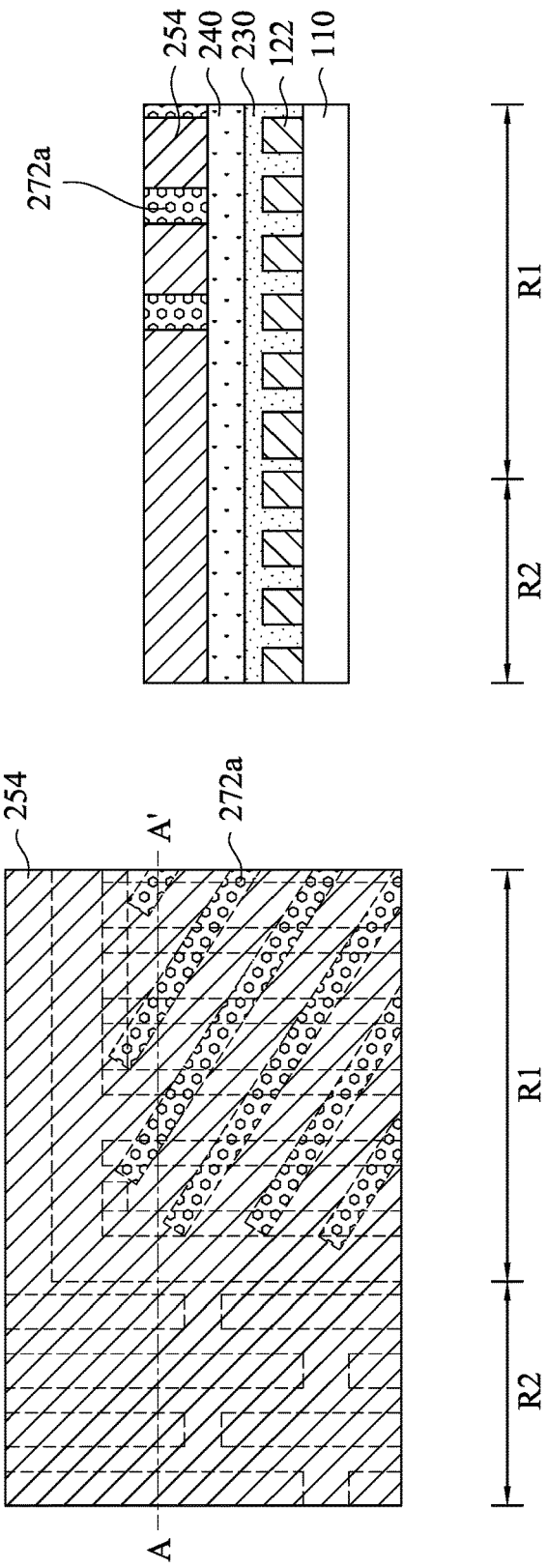

Subsequently, an upper portion of the second-hardmask layer 280 is removed to expose the top surfaces of the spacers 272*a*, as shown in FIG. 17A and FIG. 17B. In one embodiment, the upper portion of the second-hardmask layer 280 may be removed by a chemical mechanical polish (CMP) process, an etch back process, or the like.

Figure 18B:
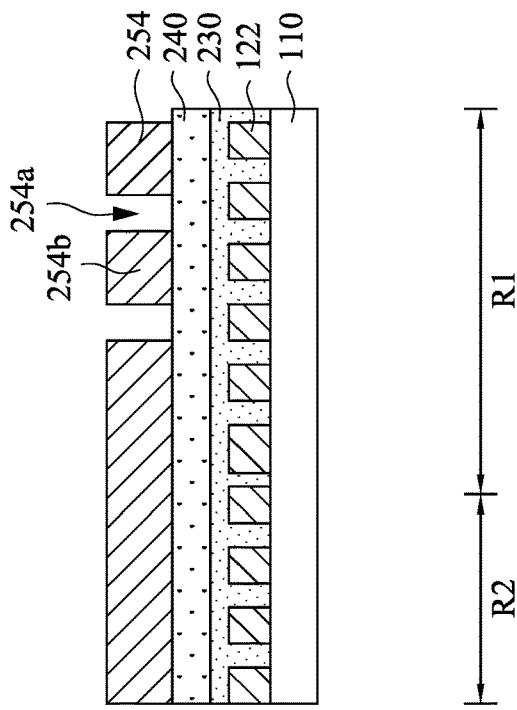
Figure 18A:
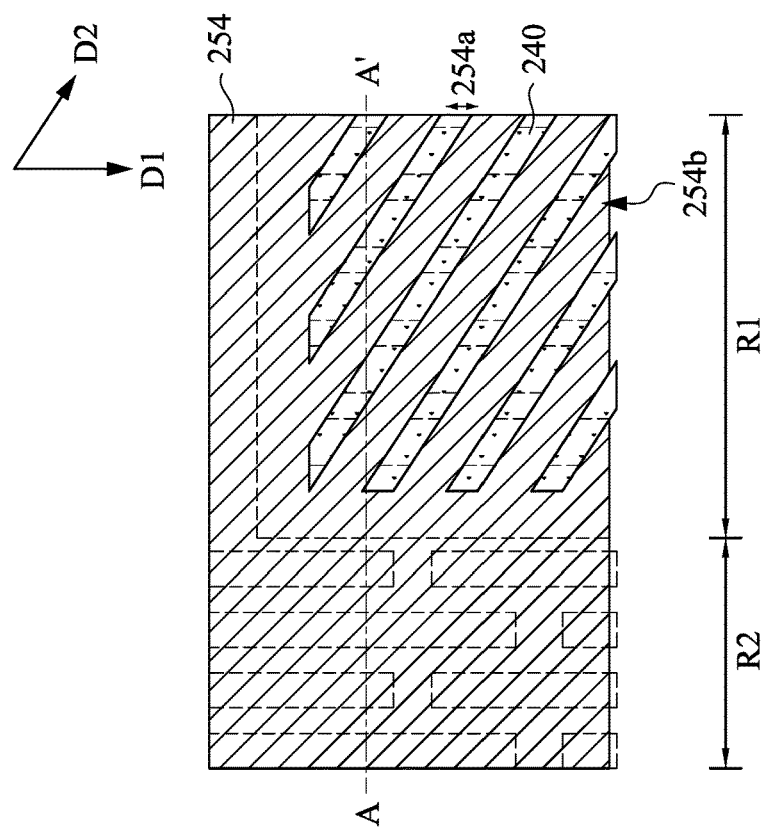

The spacers 272*a* is then removed, thereby a patterned upper hardmask layer 254 is formed on the middle hardmask layer 240, as shown in FIG. 18A and FIG. 18B. The patterned upper hardmask layer 254 has a plurality of second openings 254*a* and a plurality of second stripes 254*b*. Each of the second openings 254*a* is located between adjacent ones of the second stripes 254*b*. The second openings 254*a* and the second stripes 254*b* are extended along the second direction D2 that is different from the first direction D1. The second openings 254*a* expose a portion of the middle hardmask layer 240.

In some embodiments of the invention, the patterned upper hardmask layer 254 and the middle hardmask layer 240 are made of different material, that is, the patterned upper hardmask layer 254 may have an etch selectivity different from the middle hardmask layer 240.

Figures 19A, 19B:
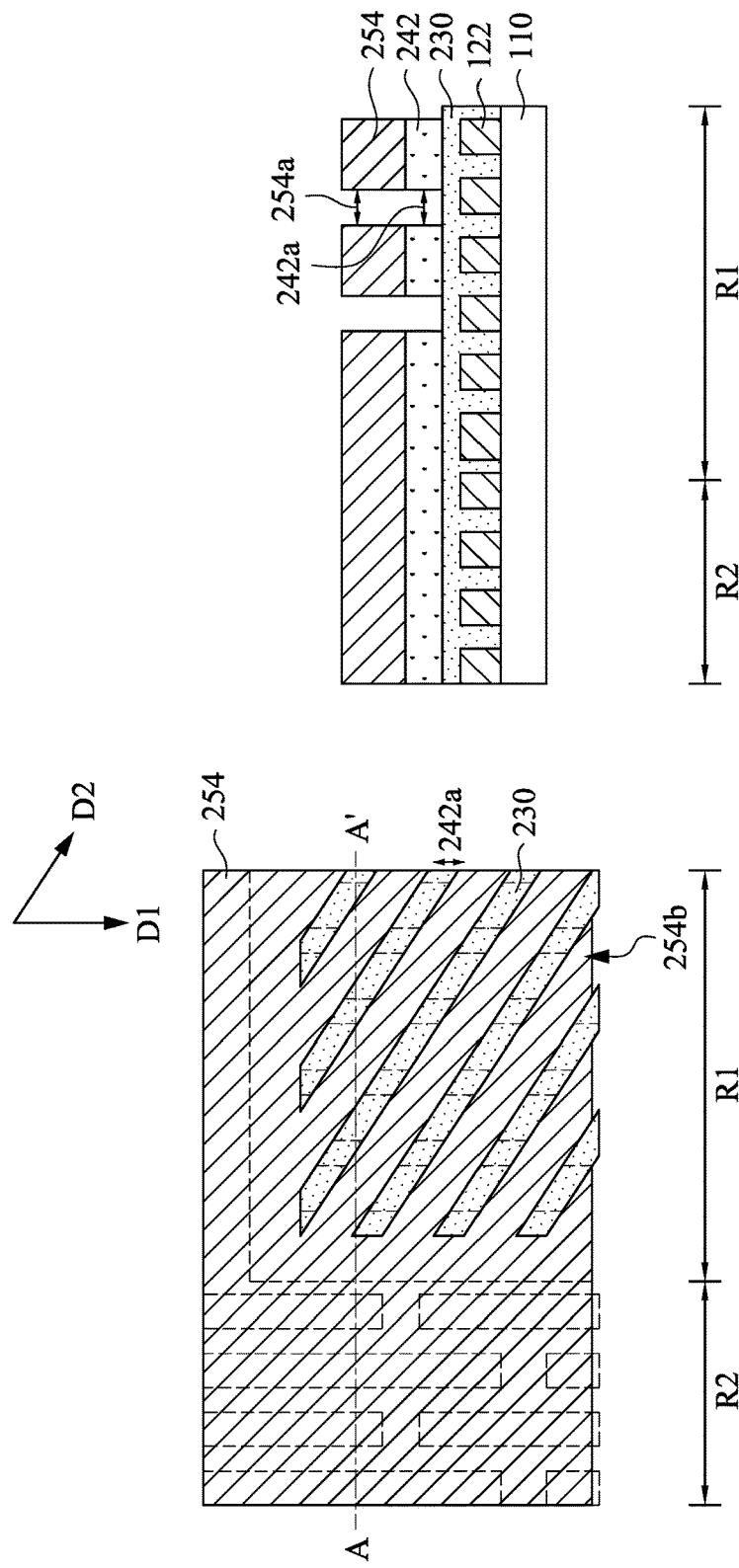

The exposed portion of the middle hardmask layer 240 is etched by using the patterned upper hardmask layer 254 as a mask, as shown in FIG. 19A and FIG. 19B. Therefore, a patterned middle hardmask layer 242 is formed under the patterned upper hardmask layer 254. The patterned middle hardmask layer 242 has a plurality of third openings 242*a* corresponding to the second openings 254*a* of the patterned upper hardmask layer 254. The third openings 242*a* are extended along the second direction D2 and exposing a portion of the lower hardmask layer 230.

The exposed portion of the lower hardmask layer 230 and the first patterned target layer 122 thereunder are etched by using the patterned upper hardmask layer 254 as a mask. In some embodiments, the exposed portion of the lower hardmask layer 230 is completely removed, but the target layer 122 is partially etched. The patterned upper hardmask layer 254, the patterned middle hardmask layer 242 and the remaining portion of the lower hardmask layer 230 are then removed.

Figure 20A:
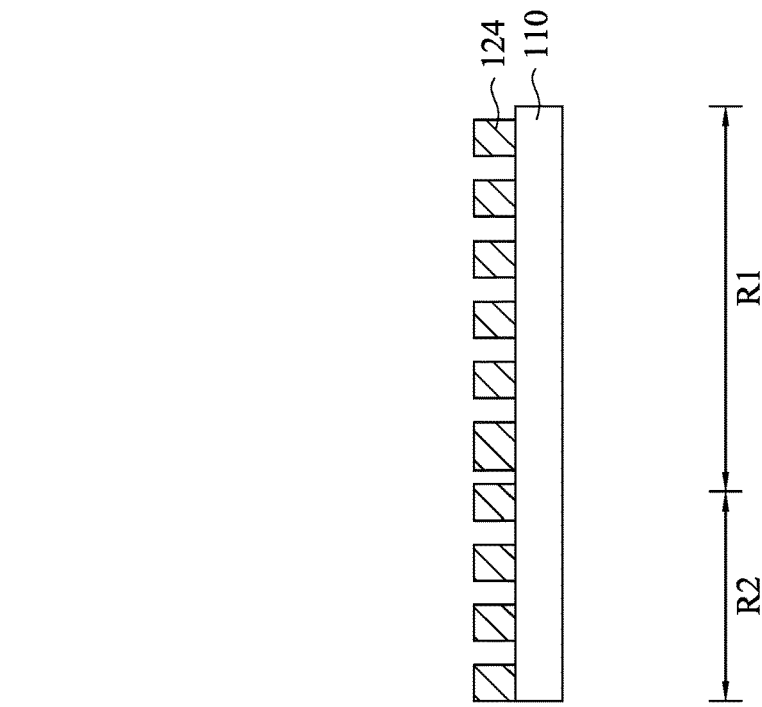
Figure 20B:
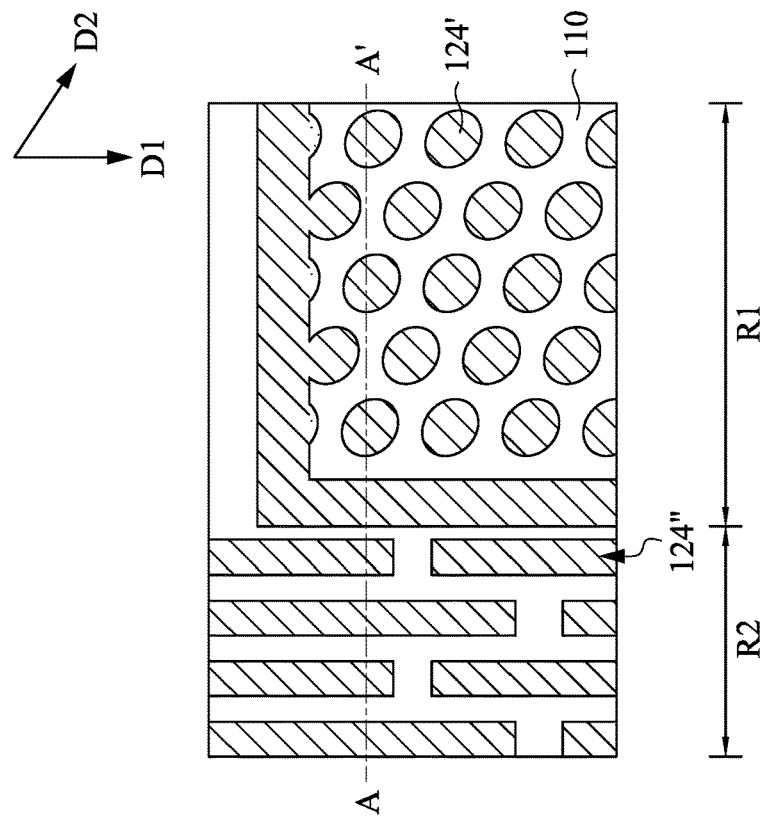

As shown in FIG. 20A and FIG. 20B, a second patterned target layer 124 is therefore formed on the substrate 110. The second patterned target layer 124 has a plurality of rounded patterns 124' on the first region R1 of the substrate 110. Meanwhile, the second patterned target layer 124 has a plurality of stripe pattern 124" on the second region R2 of the substrate 110. The stripe pattern 124" is substantially the same with the first stripes 122*b* that is located in the second region R2 shown in FIG. 10A. It is noted that the etching of the exposed portion of the lower hardmask layer 230 and the first patterned target layer 120 thereunder includes cutting the first stripes 122*b* shown in FIG. 10A over the first region R1 of the substrate 110.

The present invention provides a method for manufacturing a semiconductor structure having fine patterns. Specifically, the method includes forming a plurality of fine patterns with different patterns, such as rounded patterns and stripe patterns. These different patterns may be formed in a less complicated method as provided herein and, therefore, cost-effective.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of manufacturing a semiconductor device, comprising operations of:
    forming a first patterned target layer on a substrate having a first region and a second region, wherein the first patterned target layer has a plurality of first stripes and a plurality of first openings on the first and second regions and extending along a first direction, each first opening is disposed between adjacent ones of the first stripes and exposing a portion of the substrate;
    sequentially forming a lower hardmask layer and a middle hardmask layer covering the first patterned target layer;
    forming a patterned upper hardmask layer on the middle hardmask layer, wherein the patterned upper hardmask layer has a plurality of second stripes and a plurality of second openings each between adjacent ones of the second stripes, the second stripes and the openings are positioned on the first region and along a second direction that is different from the first direction, and the second openings expose a portion of the middle hardmask layer;
    etching the exposed portion of the middle hardmask layer to form a plurality of third openings along the second direction and exposing a portion of the lower hardmask layer; and
    etching the exposed portion of the lower hardmask layer and the first patterned target layer thereunder to form a second patterned target layer, wherein the second patterned target layer has a plurality of rounded patterns on the first region of the substrate.

2. The method of claim 1, wherein each first opening has a width less than a width of each first stripe.

3. The method of claim 1, wherein forming the patterned upper hardmask layer on the middle hardmask layer comprises:
    depositing a first-hardmask layer overlaying the middle hardmask layer;
    patterning the first-hardmask layer to form at least a trench along the second direction;
    forming spacers on sidewalls of the trench along the second direction;
    forming a second-hardmask layer covering the patterned first-hardmask layer and the spacers, and filling a remaining space of the trench;
    removing a portion of the second-hardmask layer to expose the spacers; and
    removing the spacers, thereby forming the patterned upper hardmask layer having the second stripes and second openings.

4. The method of claim 1, wherein etching the exposed portion of the lower hardmask layer and the first patterned target layer thereunder comprises cutting the first stripes over the first region of the substrate.

5. The method of claim 1, wherein the middle hardmask layer is a single layer.

6. The method of claim 1, wherein the middle hardmask layer comprises two layers.

7. The method of claim 1, wherein the middle hardmask layer and the patterned upper hardmask layer are made of different material.

8. The method of claim 1, wherein forming the first patterned target layer comprising:
    forming a target layer, a first shielding layer, a second shielding layer, and a third shielding layer in sequence on the substrate;
    patterning the third shielding layer to form a patterned third shielding layer, wherein the patterned third shielding layer has a plurality of openings exposing a portion of the second shielding layer;
    partially etching the portion of the second shielding layer to form a patterned second shielding layer having a plurality of protruding portions and a plurality of recesses each between adjacent ones of the protruding portions, wherein the protruding portions and the recesses extend along the first direction;

removing the patterned third shielding layer;

forming a fourth shielding layer on the patterned second shielding layer;

forming a patterned photoresist layer on the fourth shielding layer, wherein the patterned photoresist layer has a plurality of stripe patterns and a plurality of apertures each between adjacent ones of the stripe patterns, the stripe patterns and the apertures extend along the first direction, and the stripe patterns are aligned with the recesses of the patterned second shielding layer;

selectively etching the fourth shielding layer using the patterned photoresist layer as a mask to expose the protruding portions of the patterned second shielding layer;

selectively etching the patterned second shielding layer and the first shielding layer using the protruding portions and the patterned photoresist layer as a mask to expose a portion of the target layer; and etching the exposed portion of the target layer to form the first patterned target layer.

9. The method of claim 3, wherein forming the spacers on the sidewalls of the trench comprises:

depositing a spacer layer having vertical portions on the sidewalls of the trench and a horizontal portion on a bottom of the trench; and removing the horizontal portion to expose the bottom of the trench, wherein the vertical portions are remained and form the spacers.

10. The method of claim 9, wherein each spacer has a width less than a width of the trench.

11. The method of claim 1, wherein the lower hardmask layer and the middle hardmask layer are made of different material.

12. The method of claim 11, wherein the lower hardmask layer comprises amorphous carbon, silicon oxide, silicon nitride, silicon oxynitride, silicon or polysilicon oxide.

13. The method of claim 11, wherein the middle hardmask layer comprises silicon oxide, silicon nitride, silicon oxynitride or silicon.

14. The method of claim 11, wherein the patterned upper hardmask layer comprises amorphous carbon, silicon oxide, silicon nitride, silicon oxynitride, silicon or polysilicon oxide.

* * * * *